United States Patent [19]
Kawamura et al.

[11] Patent Number: 6,044,097
[45] Date of Patent: Mar. 28, 2000

[54] MODULATOR INTEGRATED DISTRIBUTED FEED-BACK LASER DIODE MODULE AND DEVICE USING THE SAME

[75] Inventors: Hiromitsu Kawamura; Kazuhiro Yamaji; Hisashi Hamaguchi; Haruhisa Soda; Kiyotsugu Kamite, all of Kawasaki, Japan

[73] Assignee: Fujitsu Limited, Kawasaki, Japan

[21] Appl. No.: 08/268,039

[22] Filed: Jun. 29, 1994

[30] Foreign Application Priority Data

Jun. 30, 1993 [JP] Japan ..................................... 5-161839

[51] Int. Cl.[7] ........................................... H01S 3/096
[52] U.S. Cl. ........................................................ 372/38
[58] Field of Search ............................... 372/38, 50, 26, 372/43

[56] References Cited

U.S. PATENT DOCUMENTS

| | | | |
|---|---|---|---|
| 4,177,436 | 12/1979 | Dixon et al. ............................... | 372/38 |
| 4,238,707 | 12/1980 | Malissin et al. ........................... | 372/38 |

FOREIGN PATENT DOCUMENTS

| | | |
|---|---|---|
| 57-145385 | 9/1982 | Japan . |
| 2-018978 | 1/1990 | Japan . |
| 2-082681 | 3/1990 | Japan . |

OTHER PUBLICATIONS

Suzuki et al., Electrical and Optical Interactions between Integrated InGaAsp/InP DFB Lasers and Electroabsorption Modulators. Journal of Lightwave Technology, vol. 6, No. 6, Jun. 1988, pp. 779–785.

Goto et al., A 10–Gb/s Optical Transmitter Module with a Monolithically Integrated Electroabsorption Modulator with a DFB Laser. IEEE Photonics Technology Leters, vol. 2, No. 12, Dec. 1990, pp. 896–898.

Suzuki, M. et al., Electrical and Optical Interactions between Integrated InGaAsP/InP DFB Lasers and Electroabsorption Modulators. Journal of Lightwave Technolgy, vol. 6, No. 6, Jun. 1988, pp. 779–785.

Kawamura, H. et al., A Modulator Integrated Distributed Feed–Back Laser Diode Module for 2.5Gb/s 210km Optical Transmission.ECOC'92, 18th European Conference on Optical Communications, 1 Proceedings, vol. 1, Regular Papers, pp. 157–160, Sep. 1992.

*Primary Examiner*—James W. Davie
*Attorney, Agent, or Firm*—Armstrong, Westerman, Hattori, McLeland & Naughton

[57] ABSTRACT

An optical semiconductor device circuit including a MI-DFB-LD capable of minimizing an extension in the wavelength of the output light in order to improve transmission speed and distance. The optical device circuit includes a semiconductor laser diode; an optical modulator for modulating output light of the semiconductor laser diode; a resistive element which is connected to the laser diode and which operates as a resistor at a high frequency; common connection substrate connected to the semiconductor laser diode and to the optical modulator; impedance element or signal reflection element connected to the common connection substrate; and ground connected to the impedance element or the signal reflection element.

3 Claims, 19 Drawing Sheets

DRIVE SIGNAL

OPTICAL INTENSITY

DUE TO RELAXATION OSCILLATION

DUE TO RELAXATION OSCILLATION

WAVELENGTH

MODULATOR INTEGRATED DISTRIBUTED FEED-BACK LASER DIODE MODULE AND DEVICE USING THE SAME

BACKGROUND OF THE INVENTION

(1) Field of the Invention

The present invention relates to a distributed feed-back laser diode module containing an integrated modulator in which an optical modulator is used to modulate light output from a semiconductor laser diode so that output light has a stable wavelength and an optical semiconductor device using the same. More particularly, this invention is related to an optical semiconductor device capable producing light with a stable wavelength.

(2) Description of the Related Art

In an optical communication system, light output from a semiconductor laser diode is modulated by applying a drive signal, and the modulated light is input into an optical fiber. The light signal is detected at the opposite end of the optical fiber.

Optical communication can provide a high transmission speed because of the high frequency of light itself, and the excellent monochromaticity of light generated by a semiconductor laser diode; that is, the excellent stability in frequency of the light. Nevertheless, there is a demand for a higher transmission speed. In typical digital optical communication, the longer the transmission distance is, the more critical the monochromaticity of the light becomes. For optical communication, therefore, a distributed feedback (DFB) type semiconductor laser diode, which includes a diffraction grating has been employed.

However, when the light from a semiconductor laser diode is modulated by a digital signal, the actual light output fluctuates. Therefore, even when a semiconductor laser diode having a DFB structure is employed, the wavelength characteristic of the light changes. When the wavelength extends, transmission time differs in optical fibers due to the dispersion characteristics of the optical fibers. The transmittable signal frequency is restricted accordingly.

In an effort to minimize the foregoing extension in wavelength of the output light, an optical semiconductor device in which a modulator is provided to modulate light output of the semiconductor laser diode has been proposed. In this optical semiconductor device, since current flowing through the semiconductor laser diode is constant, the semiconductor laser diode emits constant output light whose wavelength does not extend. The output light is emitted into the optical modulator adjoining the semiconductor laser diode. The optical modulator transmits the input light in a normal state, but it does not transmit the input light when a reverse voltage is applied to P-N junction of the modulator. This type of optical modulator is called an electroabsorption modulator, and this type of optical semiconductor device is called a Modulator Integrated Distributed Feedback Laser Diode (MI-DFB-LD).

The present invention is applied to this type of optical semiconductor device.

This type optical semiconductor device is realized by two manufacturing methods. In one method, the semiconductor laser diode and the optical modulator are formed on a same semiconductor substrate which operates as the ground electrode of the semiconductor laser diode and of the optical modulator. In the other method, the semiconductor laser diode and the optical modulator are independently formed, then they are arranged on a conductive base element so that ground electrodes on the diode and the modulator are adhered to the conductive base element and their optical axes coincide each other. Alternately, in the optical semiconductor device, the semiconductor laser diode and the optical modulator are electrically connected via the common conductive element (the semiconductor substrate or the conductive base element). The optical semiconductor device is installed in a package, and it is called an optical module.

The semiconductor laser diode is susceptible to temperature. The intensity and wavelength of light output from the semiconductor laser diode change with temperature. To suppress this influence of temperature, the integrated optical device is encapsulated in a temperature controller for stabilizing the temperature. For example, a Peltier element is used as the temperature controller. In this case, a portion including the MI-DFB-LD must be arrange so that thermal transfer to or from surrounding devices is minimized. Generally speaking, electroconductive material is also heat-conductive. Therefore, the common conductive element shared by the semiconductor laser diode and the optical modulator is therefore connected to a ground terminal of the optical module via an electrical conductor having a small thermal conductivity such as a narrow metallic wire or a conductive bridge. From the electrical aspect, this electric conductor acts as an impedance. Namely, this means that the semiconductor laser diode and the optical modulator are connected to a ground terminal of the optical module via an impedance. Particularly, the impedance appearing between the common conductive element and ground is relatively large at a high frequency.

In order to drive the optical modulator, a drive signal which changes between a positive voltage and a negative voltage at a very high frequency is applied to the optical modulator. This drive signal is conveyed to the common conductive element through the optical modulator. If the common conductive element is connected to ground via a low impedance, the high frequency signal appearing at the common conductive element does not influence the current through the semiconductor laser diode. However, as described above, the impedance between the common conductive element and ground is comparatively large, therefore, the current through the semiconductor laser diode fluctuates in response to the high frequency signal appearing at the common conductive element. If this high frequency signal passes the semiconductor laser diode, an intensity of the light generated by the semiconductor laser diode fluctuates.

Further, when a reverse voltage is applied to the optical modulator, light absorption current abruptly grows. Accordingly, when a drive signal is applied to the optical modulator, a current through the optical modulator abruptly varies. Due to this current variation, a high frequency signal appears at the common conductive element. When the impedance between the common conductive element and ground is comparatively large, this high-frequency signal also causes a fluctuation in the current through the semiconductor laser diode.

In this way, the drive signal affects the semiconductor laser diode.

As a result, the light output intensity of the semiconductor laser diode fluctuates, and the wavelength of the output light changes. Eventually, the transmission speed and distance are reduced.

This problem occurs when common ground electrodes of the semiconductor laser diode and the optical modulator are connected to ground via an element having a large impedance.

Therefore, for example, although the element with an impedance does not exist in the optical module, the same problem will occur when the impedance of an element connected between a ground pin of the optical module and ground is large.

Further, when a signal reflection element which reflects a signal is arranged in place of the impedance element or the signal reflection element is arranged with the impedance element, the same problem will occur.

Namely, when the semiconductor laser diode and the optical modulator are connected to ground via a common impedance element or a signal reflection element, the above-mentioned problem will occur.

SUMMARY OF THE INVENTION

An object of the present invention is to realize an optical semiconductor device capable of minimizing the extension in wavelength of its output light in order to improve the transmission speed and distance that are otherwise restricted due to an extension in wavelength.

An optical semiconductor device according the first aspect of the present invention comprises a semiconductor laser diode; an optical modulator for modulating light output by the semiconductor laser diode in response to an applied modulation signal; resistor means which substantially operates as a resistor, at least at high frequencies and is connected to an electrode of the semiconductor laser diode to which electrode a bias current is input to generate light; common connection means connected to one electrode of the semiconductor laser diode and to one electrode of the optical modulator; impedance means or signal reflection means connected to the common connection means; and ground means connected to the impedance means or the signal reflection means.

The abrupt fluctuation, namely, the high frequency signal at the common connection means due to the drive signal is conveyed to ground via two paths, one path is through the impedance means or signal reflection means, and the other path is through the semiconductor laser diode. According to the first aspect, since the resistor means operates as resistor means at least in high frequency range, the high frequency signal at the common connection means mainly travels through the impedance means or signal reflection means, and it hardly travels through the semiconductor laser diode. As a result, the influences of the drive signal on the semiconductor laser diode can be reduced.

An optical semiconductor device according the second aspect of the present invention comprises a semiconductor laser diode; an optical modulator for modulating light output by the semiconductor laser diode in response to an applied modulation signal; common connection means connected to one electrode of the semiconductor laser diode and to one electrode of the optical modulator; a bypass capacitor whose terminals are respectively connected to an electrode of the semiconductor laser diode to which electrode a bias current is input and to the common connection means; impedance means or signal reflection means connected to the common connection means; and ground means connected to the impedance means or the signal reflection means.

According to the second aspect, in the high frequency range, the path from the common conductive element to the electrode of the semiconductor laser diode to which electrode a bias current is input is further divided into two paths, one path is through the laser diode, and the other path is through the bypass capacitor. Since the high frequency signal easily travels through the bypass capacitor, the high frequency signal at the common connection means due to the drive signal mainly travels through the bypass capacitor, and it hardly travels through the semiconductor laser diode. As a result, the influence of the drive signal on the semiconductor laser diode can be reduced.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Before proceeding to a detailed description of the preferred embodiments of the present invention, a prior art optical device for optical communication will be described below for a clearer understanding of the differences between the present invention and the prior art.

Figure 1:
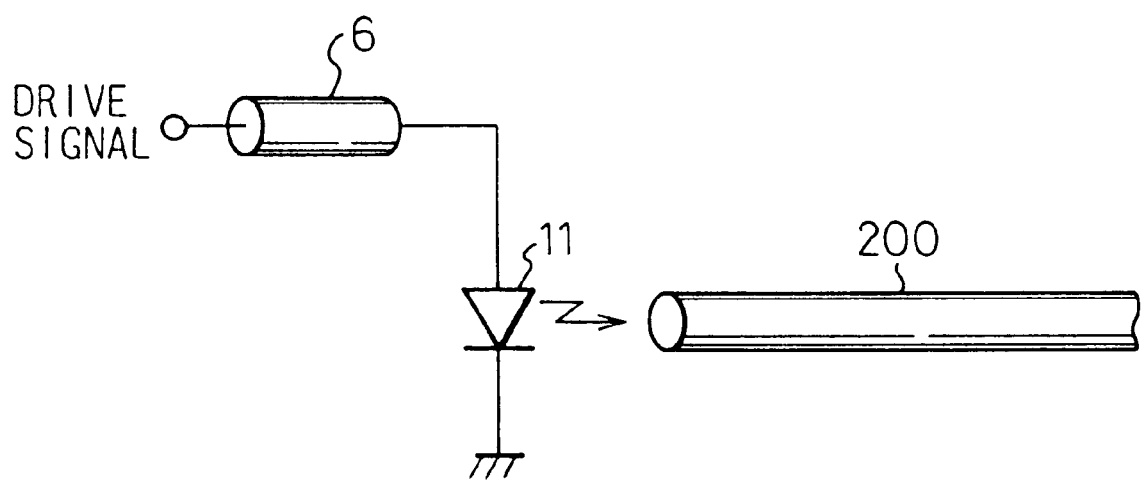
FIG. 1 shows a basic configuration for optical communication using a semiconductor laser.

FIG. 1 is a diagram showing a fundamental constitution of an optical communication system. In all drawings shown in the following, components having the same functions will be assigned the same reference numerals in order to simplify the explanations.

As shown in FIG. 1, when a drive signal is transmitted through coaxial cable 6 to be applied to a semiconductor laser diode 11, its light output is modulated. The modulated light is input into an optical fiber 200. The transmitted light signal is detected at the opposite end of the optical fiber.

As described above, in an optical communication system, a distributed feedback (DFB) type semiconductor laser diode is employed.

Figure 2A:
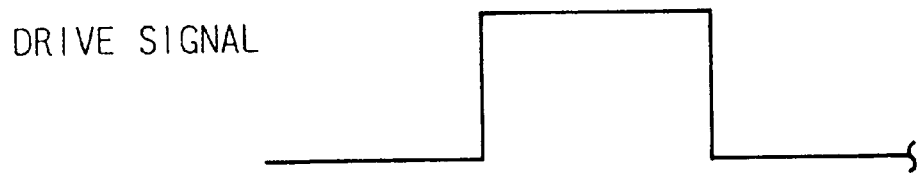
FIGS. 2A to 2C show changes in wavelength due to a drive signal.
Figure 2B:
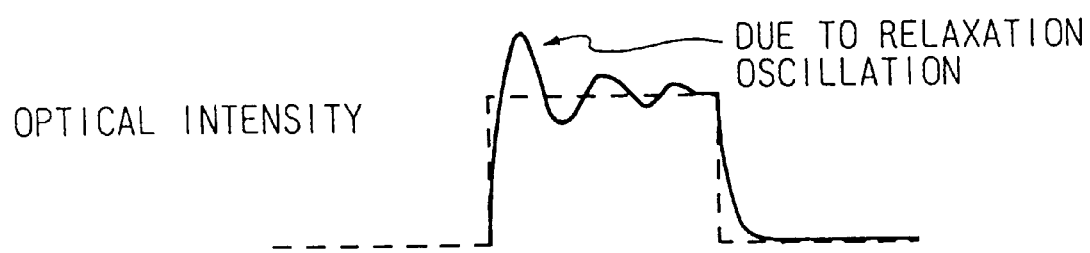
Figure 2C:
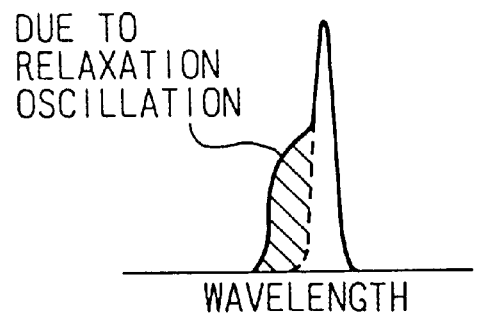

Assuming that the output of a semiconductor laser diode is modulated into a digital signal on the basis of an electric signal shown in FIG. 2A, the intensity of the actual optical output fluctuates as shown in FIG. 2B. Therefore, even when a DFB type semiconductor laser diode is employed, the wavelength characteristic of the output light changes as shown in FIG. 2C. A hatched area represents a component of the output light generated by the fluctuations. When the wavelength extends as shown in FIG. 2C, transmission time differs due to the dispersion characteristics of the optical fibers. The transmittable signal frequency is accordingly restricted.

In order to reduce the above extension in the wavelength of the output light, there has been proposed a Modulator Integrated Distributed Feed-Back Laser Diode (MI-DFB-LD).

Figure 3A:
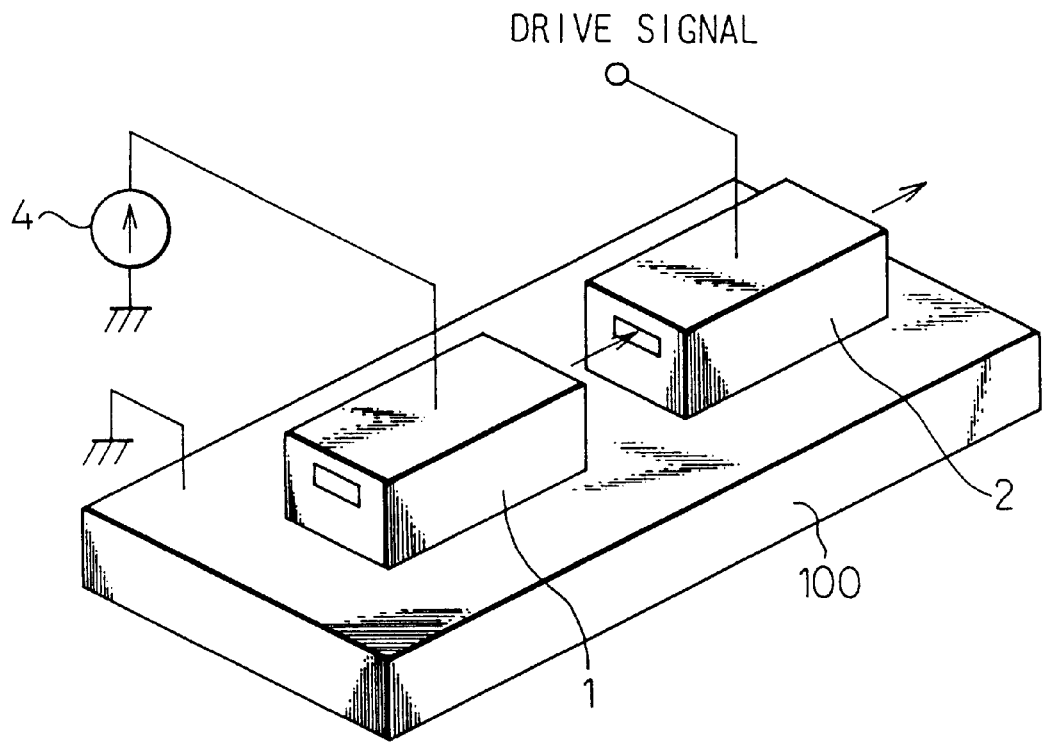
FIG. 3A is a perspective view showing an optical module (MI-DFB-LD) in which a semiconductor laser and an optical modulator are integrated.
Figure 3B:
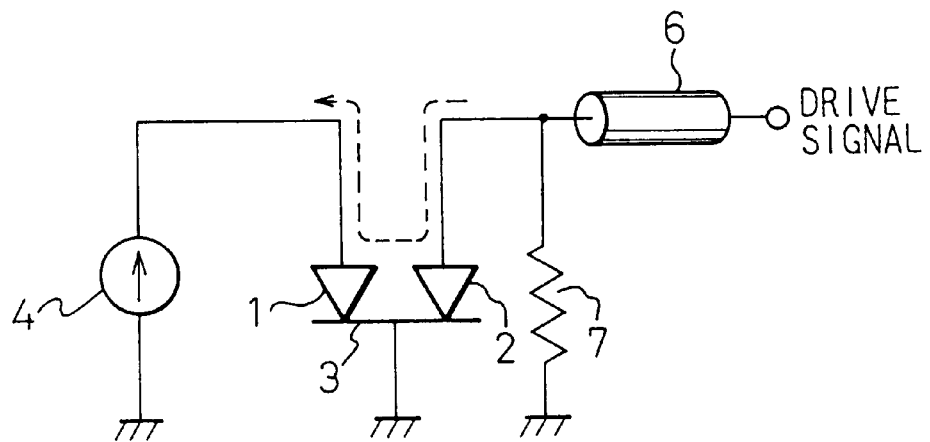
FIG. 3B is a circuit diagram of the MI-DFB-LD optical device.

FIGS. 3A and 3B show a configuration of such a MI-DFB-LD. FIG. 3A is an oblique view showing an appearance of the MI-DFB-LD. FIG. 3B is a circuit diagram of the MI-DFB-LD.

In FIG. 3A, reference numeral 1 denotes a distributed feedback type semiconductor laser diode (DFB-LD); and 2 denotes a modulator. For manufacturing convenience, the semiconductor laser diode 1 and modulator 2 must be formed on the same semiconductor substrate 100, therefore, the semiconductor laser diode 1 and modulator 2 are integrated as illustrated. The semiconductor substrate 100 forms one terminal of the semiconductor laser diode 1 and the optical modulator 2. 4 denotes a DC constant-current source. Since current flowing through the semiconductor laser diode 1 is constant, the semiconductor laser diode 1 emits stable output light whose wavelength hardly extends. The output light is emitted into the optical modulator 2 adjoining the semiconductor laser diode 1.

Figure 4:
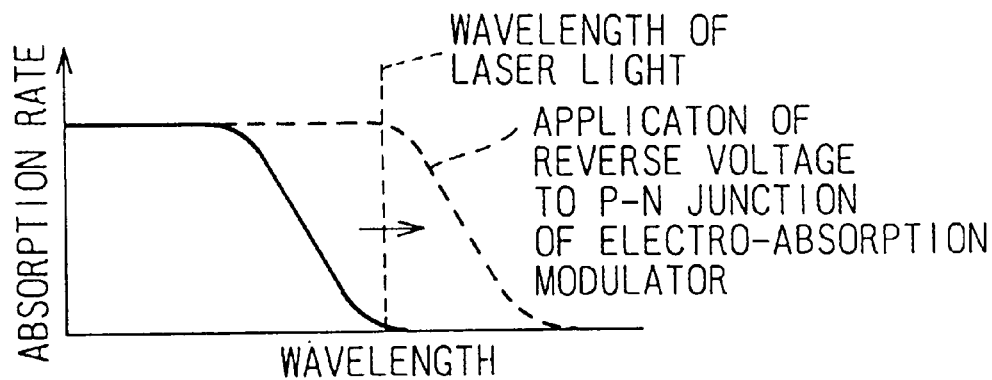
FIG. 4 is a diagram for explaining the principle of operation of the optical device shown in FIGS. 3A and 3B.

It is well-known that some kinds of semiconductors exhibit the Franz-Keldysh effect. This means that, when a reverse voltage is applied, an intrinsic absorption rate shifts to a longer wavelength. FIG. 4 shows the Franz-Keldysh effect. The optical modulator 2 in FIG. 3A utilizes the Franz-Keldysh effect to modulate laser light. As shown in FIG. 4, a wavelength of laser light is set to a value associated with an intrinsic absorption rate. Thus, when reverse voltage is not applied, the laser light is transmitted. When reverse voltage is applied, the laser light is absorbed. Because of this effect, modulation can be effected so that laser light emanating from the semiconductor laser diode 1 may or may not be transmitted depending on whether or not reverse voltage is applied to the optical modulator 2. The absorption of the laser light causes absorption current to flow through the optical modulator.

FIG. 3B shows the circuitry of the optical device shown in FIG. 3A. In FIG. 3B, reference numeral 3 denotes a common conductive element shared between the semiconductor laser diode 1 and modulator 2. The common conductive element 3 is normally grounded. Reference numeral 6 denotes a coaxial cable for transmitting the drive signal to modulator 2.

The aforesaid extension in wavelength of the output light occurring in a DFB-LD is caused by relaxation oscillation resulting from current modulation. As shown in FIG. 3B, when the semiconductor laser diode 1 is operated by constant current, the light output is stable and the change in the wavelength of the output light is quite small. Even when transmitted light is modulated by the optical modulator 2, the wavelength of the transmitted light hardly changes. In the MI-DFB-LD shown in FIG. 3A is used, an extension in the wavelength of output light can be reduced more than when the semiconductor laser diode is directly modulated. This results in an improved transmission speed and distance.

As described above, the semiconductor laser diode 1 is susceptible to temperature variation. The intensity and wavelength of the output light of the semiconductor laser diode 1 change with temperature. To suppress the influence of temperature, the MI-DFB-LD shown in FIG. 3A is encapsulated in a module which includes a temperature controller for stabilizing the temperature.

A Peltier element is widely used as a temperature controller in the conventional module.

Figure 5:
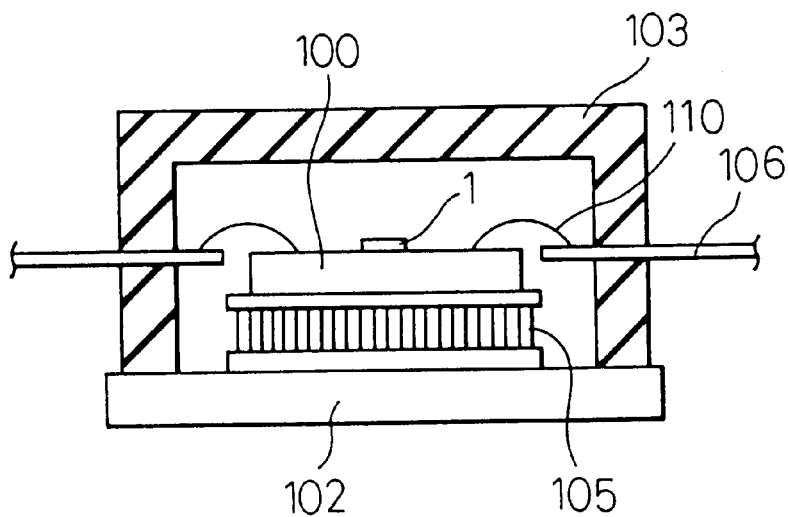
FIG. 5 shows a cross-section of a package in which the optical device and a Peltier element is provided.

FIG. 5 shows an example of a module including the MI-DFB-LD and the Peltier element.

In FIG. 5, reference numeral 1 denotes a DFB laser diode; 100 denotes a semiconductor substrate on which the semiconductor laser diode 1 and the optical modulator are formed; 102 denotes a mounting base; 103 denotes a sealing cover; 105 denotes a Peltier element; 106 denotes a lead pin having a terminal to which each electrode of the MI-DFB-LD and the Peltier element is connected; 110 denotes a bonding wire. The space within the sealing cover 103 is filled with an inert gas such as nitrogen ($N_2$), helium (He), etc.

Connections from the electrodes of the semiconductor laser diode 1 and optical modulator to the terminals of the lead pins 106 are made through electrode pads formed on the semiconductor substrate 100. An electrode on the semiconductor substrate 100 serves as ground for the MI-DFB-LD, and the electrode serves as the common conductive element shared between the semiconductor laser diode 1 and optical modulator. The Peltier element 105 transfers heat from the semiconductor substrate 100 to a mounting base 102 when power is supplied to the Peltier element 105. With the heat transfer, the semiconductor substrate 100 is cooled. In practice, the temperature in the semiconductor substrate 100 is measured, and power is supplied intermittently to the Peltier element 105. The temperature of the semiconductor substrate 100 is thus controlled to be constant.

For efficient and accurate temperature control, it is necessary to restrict heat transfer to or from the outside-of the semiconductor substrate 100. Therefore, electrical coupling between the terminal of the lead pins 106 and the semiconductor substrate 100 is achieved via a small-diameter bonding wire 110. The impedance of the bonding wire for a high-frequency current is in proportion to its diameter, therefore, an impedance appearing between the common conductive element 3 and ground is relatively large at a high frequency.

Figure 6:
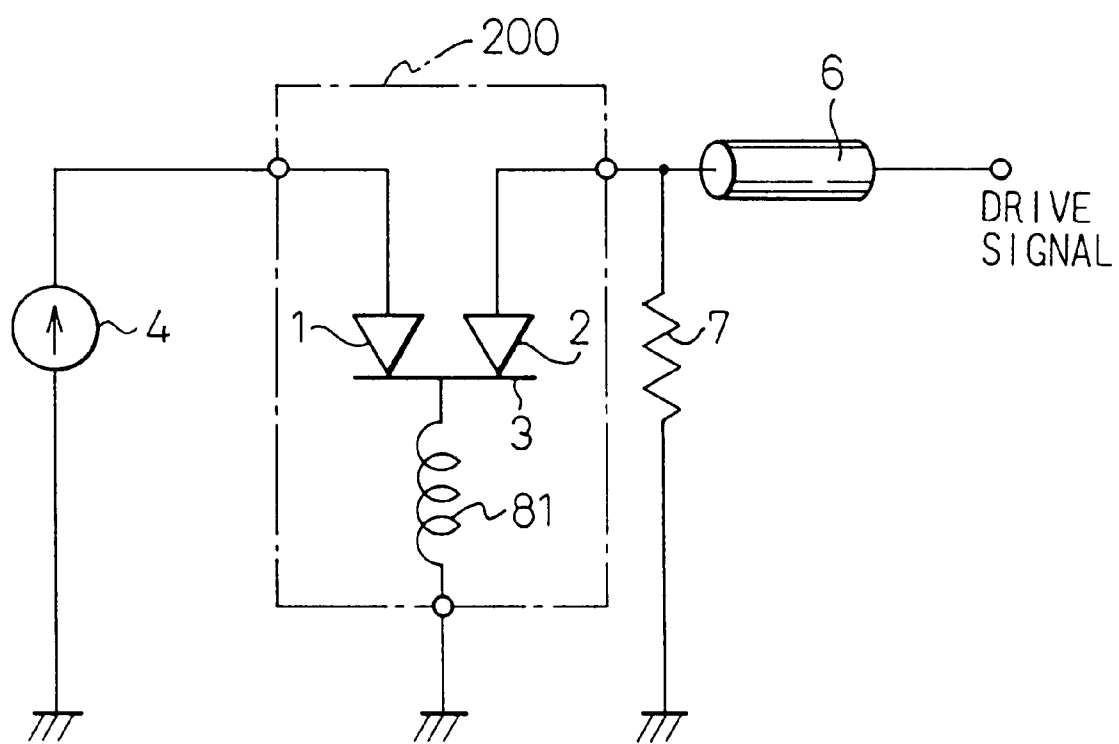
FIG. 6 shows an equivalent circuit diagram of the conventional optical semiconductor device circuit.

Therefore, the conventional optical semiconductor device has the equivalent circuit diagram shown in FIG. 6. In FIG. 6, reference numeral 200 denotes a package of the optical module; 81 denotes an impedance corresponding to the bonding wire; and 6 denotes a coaxial cable. As described above, since the impedance between the common conductive element and ground is comparatively large, a high frequency signal occurs in the common connection element due to the drive signal passes through the semiconductor laser diode. As a result, the light output intensity of the semiconductor laser diode fluctuates, and the wavelength of output light changes.

This problem occurs when common ground electrodes of the semiconductor laser diode and the optical modulator are connected to ground via an element having a relatively large impedance.

Therefore, for example, although the impedance element does not exist in the optical module, the same problem will occur when the impedance between a ground pin of the optical module and ground is large.

Further, when a signal reflection element which reflects a signal is arranged in place of the impedance element or the signal reflection element is arranged with the impedance element, the same problem will occur. E.g., the inductance component of the impedance of the bonding wire 81 in FIG. 6 corresponds to the signal reflection element.

Figure 7:
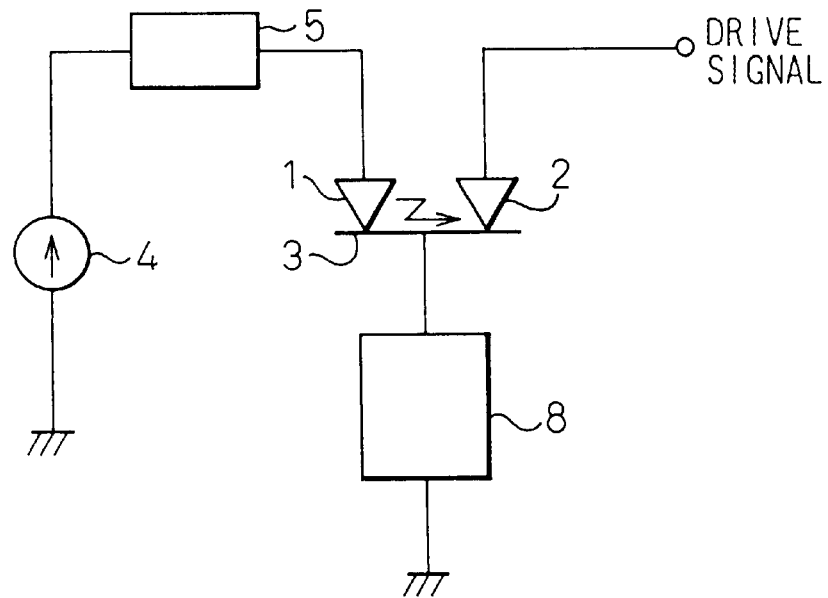
FIG. 7 show a principle and configuration of an optical semiconductor device according to a first aspect of the present invention.

FIG. 7 shows a principle and fundamental configuration of an optical device according to the first aspect of the present invention. In FIG. 7, reference numeral 1 denotes a semiconductor laser diode; 2 denotes an optical modulator for modulating the light output by the semiconductor laser diode 1 in response to an applied modulation signal; 3 denotes a common connection means connected to one electrode of the semiconductor laser diode 1 and to one electrode of the optical modulator 2; 8 denotes an impedance means or a signal reflection means which exists between the common connection means 3 and ground; and 4 denotes a power supply means which supplies a constant voltage to said semiconductor laser diode, one terminal of which is grounded; 5 denotes a resistor means connected to an electrode of said semiconductor laser diode to which a bias current is input from the power supply means 4. The resistor means 5 operates as a resistor at least at a high frequency. The common connection means 3 is connected to ground via two paths, one of which is via the impedance means or the signal reflection element 8, and the other is via the semiconductor laser diode 1, the resistor means 5 and the power supply means 4. The impedance means or the signal reflection means 8 may be in the package of the optical module or outside the optical module. The resistor means 5 can be in the package of the optical module or outside the optical module.

In the optical device shown in FIG. 7, since the resistor means 5 operates as the resistor, the impedance of the path via the laser diode 1 becomes relatively large. Consequently, the high frequency signal at the common connection means 3 due to the drive signal are more easily conveyed from the common connection means 3 to the ground via the impedance means 8, and the influence of the drive signal to the semiconductor laser diode 1 can be reduced.

Figure 8:
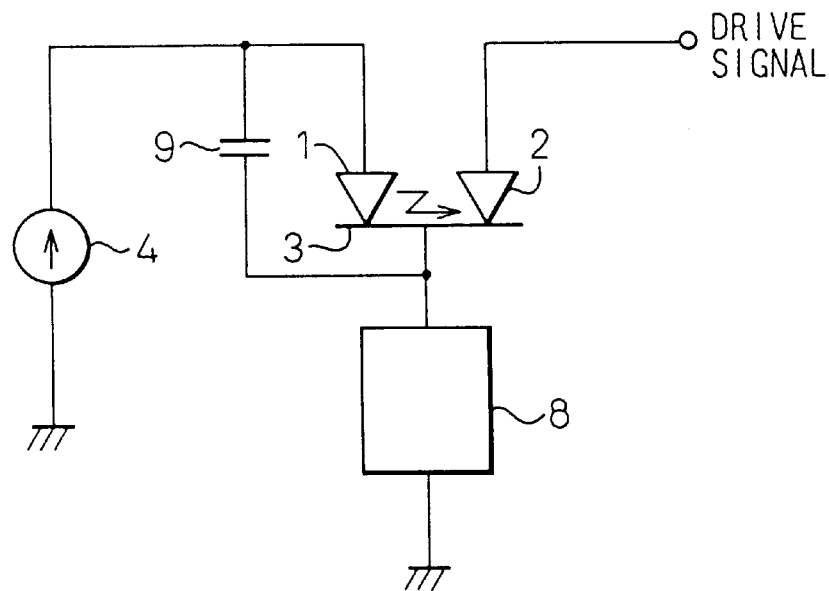
FIG. 8 show a principle and configuration of an optical semiconductor device according to a second aspect of the present invention.

FIG. 8 shows a configuration of an optical semiconductor device circuit according to the second aspect of the present invention. In comparison with FIG. 7, the resistor means 5 is omitted, and a bypass capacitor 9 is connected in parallel with the semiconductor laser diode 1.

As described above, the high frequency signal at the common connection means 3 due to the drive signal are conveyed to ground via two paths, one of which is a path including the impedance means or the signal reflection means 8, and the other is a path including the power supply means 4. In the constitution of the second aspect, the latter path is further divided into two paths, one of which is a path including the semiconductor laser diode 1, and the other is a path including the bypass capacitor 9. Because the impedance of the bypass capacitor 9 is smaller than that of the semiconductor laser diode 1, the high frequency signal which is conveyed via power supply means 4 is almost completely conveyed via the bypass capacitor 9. Therefore, an influence of the fluctuations on the semiconductor laser diode 1 can be reduced.

In the following, embodiments of the present invention will be described.

Figure 9:
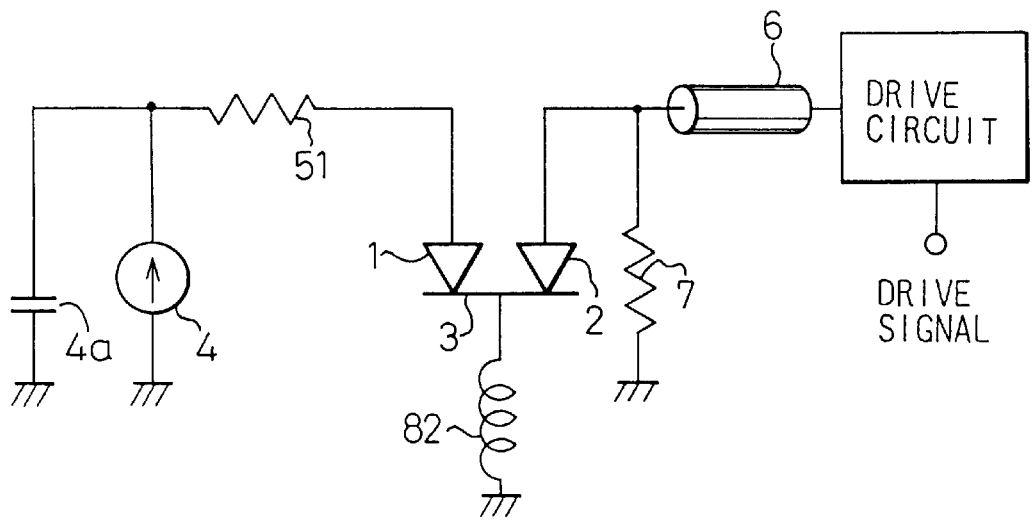
FIG. 9 is a circuit diagram of the first embodiment of the present invention.

FIG. 9 is a circuit diagram of an optical semiconductor device of the first embodiment.

In FIG. 9, reference numeral 1 denotes a semiconductor laser diode; 2 denotes an optical modulator; 3 denotes a common connection element; 82 denotes an impedance element corresponding to a bonding wire; 4 denotes a constant current source which supplies constant current to the semiconductor laser diode 1; 6 denotes a coaxial cable for transmitting a drive signal to the optical modulator 2; 7 denotes a terminator resistor; 51 denotes a resistor placed between the semiconductor laser diode 1 and the constant current source 4; and 4a denotes the parasitic capacity across the constant current source and a power source line.

Figure 10:
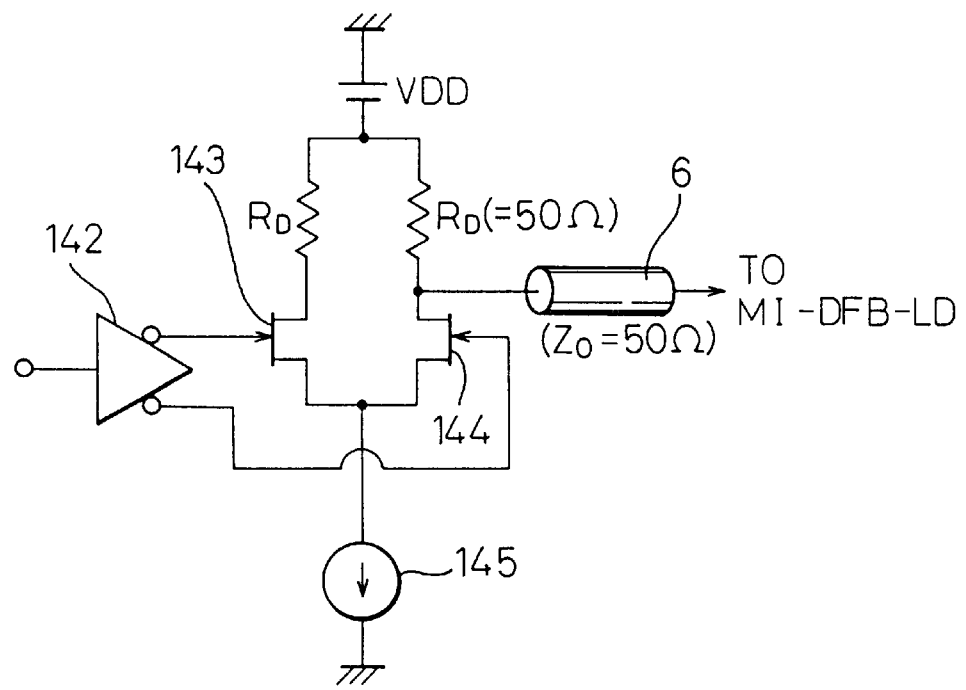
FIG. 10 is a circuit diagram of a drive circuit of an optical modulator in the first embodiment.

FIG. 10 is a circuit diagram of a drive circuit of the MI-DFB-LD.

In FIG. 10, 142 denotes a driver which outputs complementary outputs; 143 and 144 denotes transistors; and 145 denotes a constant current source. One of the transistors 143, 144 selectively turns ON according to an input signal, and a voltage between a resistor $R_D$ and the transistor 144 varies whether or not the transistor 144 turns ON. This voltage is supplied to the terminal of package which connected to the optical modulator via the coaxial cable 6.

Figure 11:
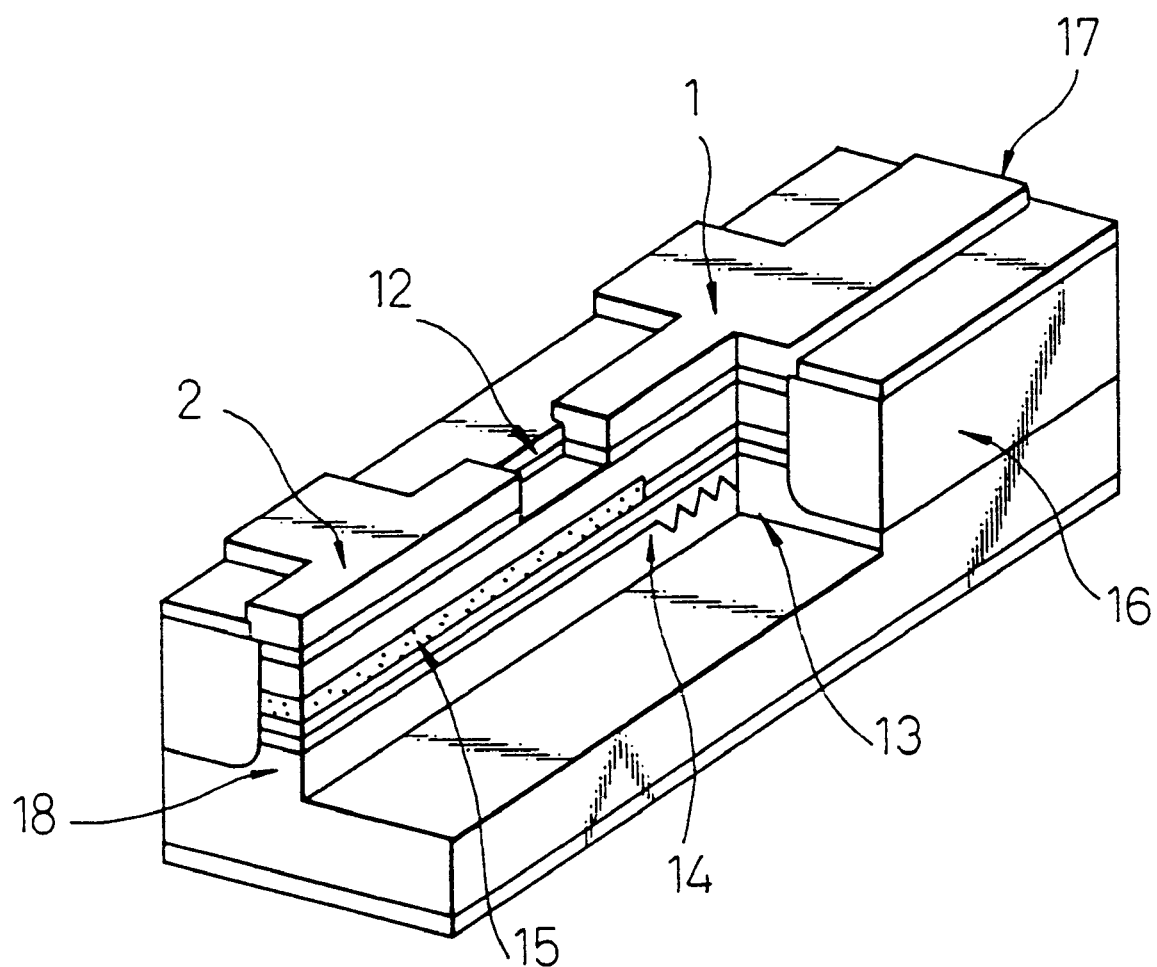
FIG. 11 is a perspective view of an optical device used in embodiments.

FIG. 11 is a schematic view of a Modulator Integrated Distributed Feed-Back Laser Diode (MI-DFB-LD) which is used in the embodiment.

In FIG. 11, reference numeral 1 denotes a DFB laser diode; 2 denotes a modulator; 12 denotes an isolation structure for isolating the DFB laser diode 1 and the modulator 2; 13 denotes an active layer; 14 denotes a butt-joint coupling; 15 denotes an absorption layer; 16 denotes a Semi-Insulating Indium Phosphorus (SI-InP) burying layer. A high-reflection coating is provided on a surface denoted by 17, and an anti-reflection coating is provided on a surface denoted by 18. Because the MI-DFB-LD is well-known, explanations regarding the MI-DFB-LD are omitted.

Figure 12A:
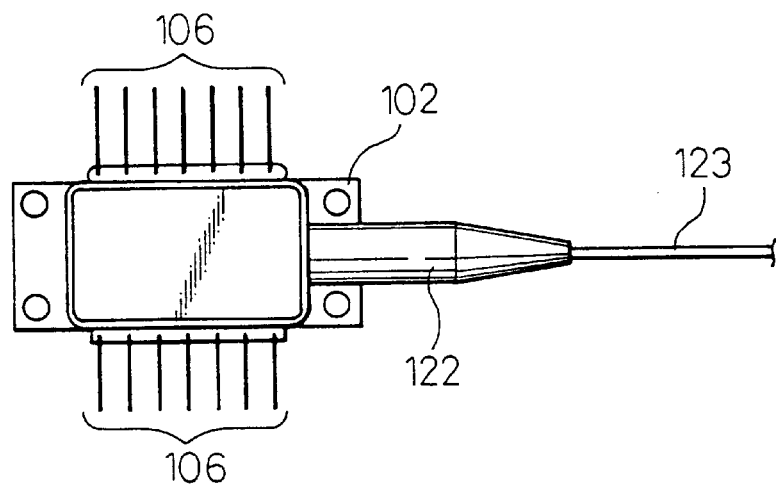
FIGS. 12A to 12C are diagrams showing a package used in embodiments in which an optical device and a Peltier element is provided.
Figure 12B:
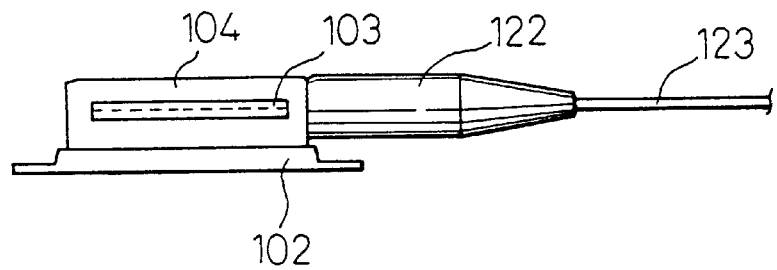
Figure 12C:
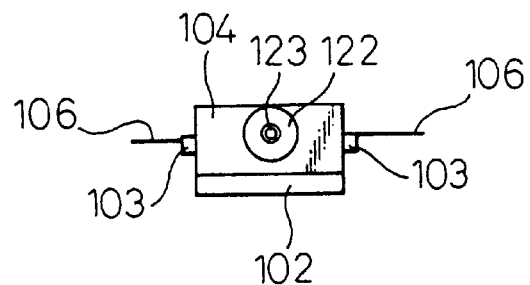

FIGS. 12A to 12C are diagrams showing a butterfly type package in which the MI-DFB-LD shown in FIG. 10 is installed.

In FIGS. 12A to 12C, reference numeral 102 denotes mounting base which corresponds to that shown in FIG. 5; 103 denotes a sealing cover made of metal; 106 denotes lead pins; 104 denote insulating elements for insulating the connection pins 106 from the sealing cover 103; 122 denotes an optical coupling connector; 123 denotes an optical fiber cable. In this package, a thermoelectric cooler, a thermistor and an optical isolator are installed.

Figure 13:
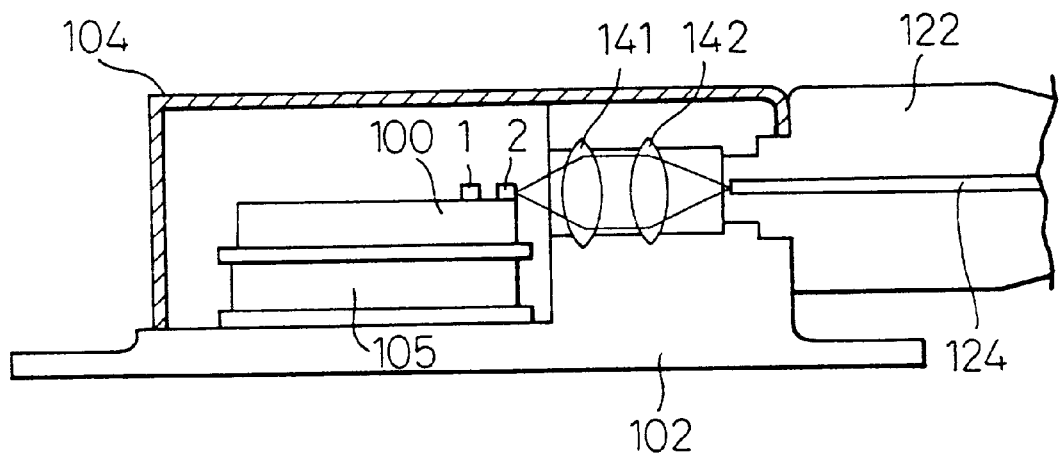
FIG. 13 is a diagram showing an internal configuration of the package shown in FIGS. 12A to 12C.

FIG. 13 is a diagram showing an internal structure of the package.

In FIG. 13, reference numeral 1 denotes a DFB laser diode; 2 denotes a modulator; 100 denotes a semiconductor substrate on which the semiconductor laser diode 1 and the optical modulator are formed; 102 denotes a mounting base; 103 denotes a sealing cover; 105 denotes a Peltier element; 122 denotes the optical coupling connector; 124 denotes an optical fiber; 141 and 142 denote aspherical lenses for focussing light emitted from the MI-DFB-LD onto an input end of the optical fiber. The Peltier element 105 transfers heat in the semiconductor substrate 100 to a mounting base 102 when power is supplied. With the heat transfer, the semiconductor substrate 100 is cooled. In practice, the temperature in the semiconductor substrate 100 is measured, and power is supplied intermittently to the Peltier element 105. The temperature in the semiconductor substrate 100 is thus controlled to be constant. For efficient and accurate temperature control, it is necessary to restrict heat transfer to or from the outside of the semiconductor substrate 100. Electrical couplings between electrode pads on the semiconductor substrate 100 and the terminals of the lead pins 106 are achieved via small-diameter bonding wires. Therefore, the resistances between the terminals on the semiconductor substrate 100 and the terminals of the lead pins 106 become large.

Figure 14:
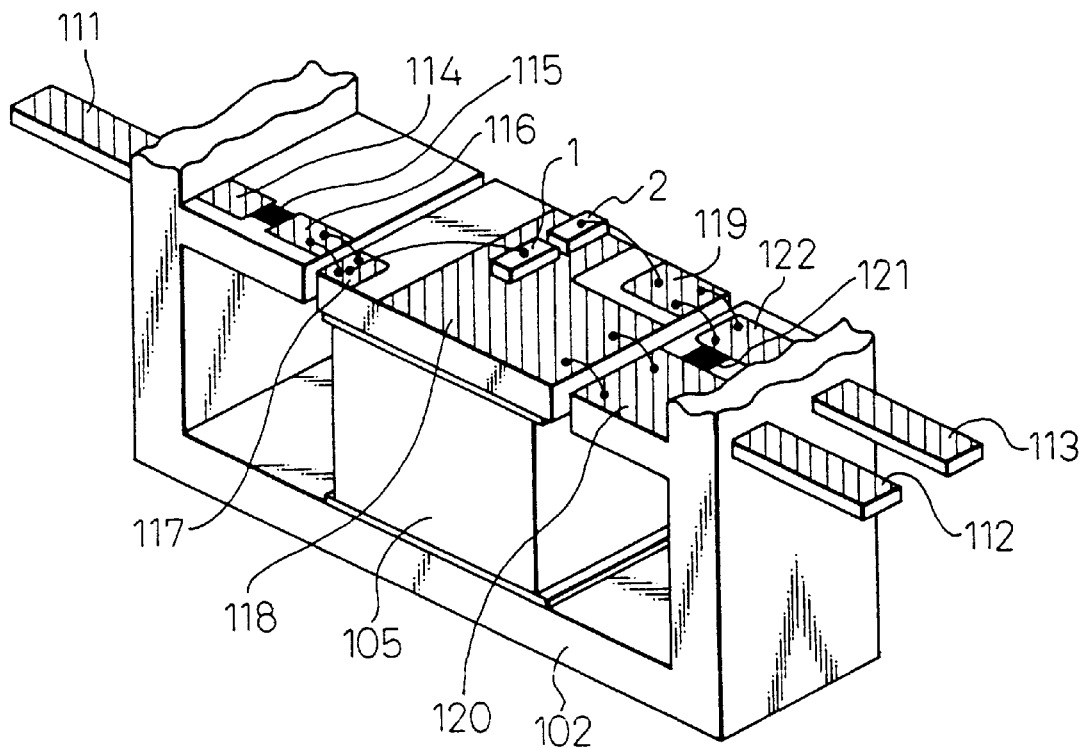
FIG. 14 is a perspective view showing a configuration of bonding wires connecting terminals of the lead pins, electrode pads and elements on the substrate and on the MI-DFB-LD of the first embodiment.
Figure 15:
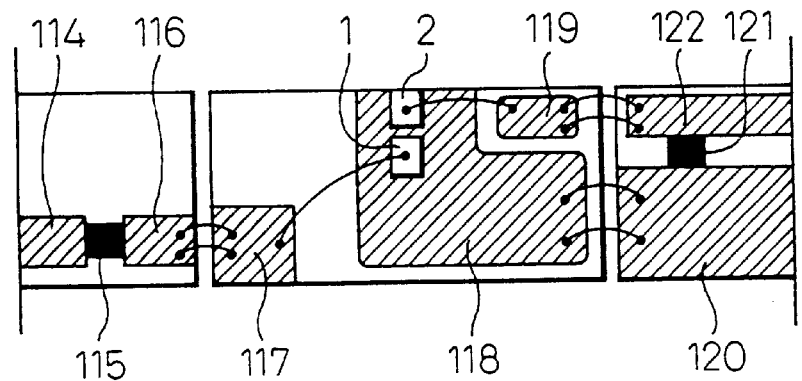
FIG. 15 is a plan view of the part shown in FIG. 14.

FIG. 14 is a perspective view showing a configuration of bonding wires connecting terminals of the lead pins, electrode pads and an element on the substrate, and the MI-DFB-LD. FIG. 15 is a plan view of the part shown in FIG. 14

In FIGS. 14 and 15, reference numerals 111, 112 and 113 denote lead pins; 114, 120 and 122 denote electrodes connected to the lead pins; 116 denotes an electrode formed on the package; 115 and 121 denote resistor elements; 117, 118 and 119 denote electrode pads formed on the module substrate. The semiconductor laser diode 1 and the optical modulator 2 are formed on the semiconductor substrate, and the electrode pad 118 serves as a ground electrode for the MI-DFB-LD. Namely, the electrode pad 118 serves as the common conductive element shared by the semiconductor laser diode 1 and optical modulator 2. Upper electrodes of the semiconductor laser diode 1 and optical modulator 2 are connected to the electrode pads 117 and 119 by the bonding wires. The resistor element 115 serves as the resistor 51, and the resistor element 121 serves as the resistor 7.

Figure 16:
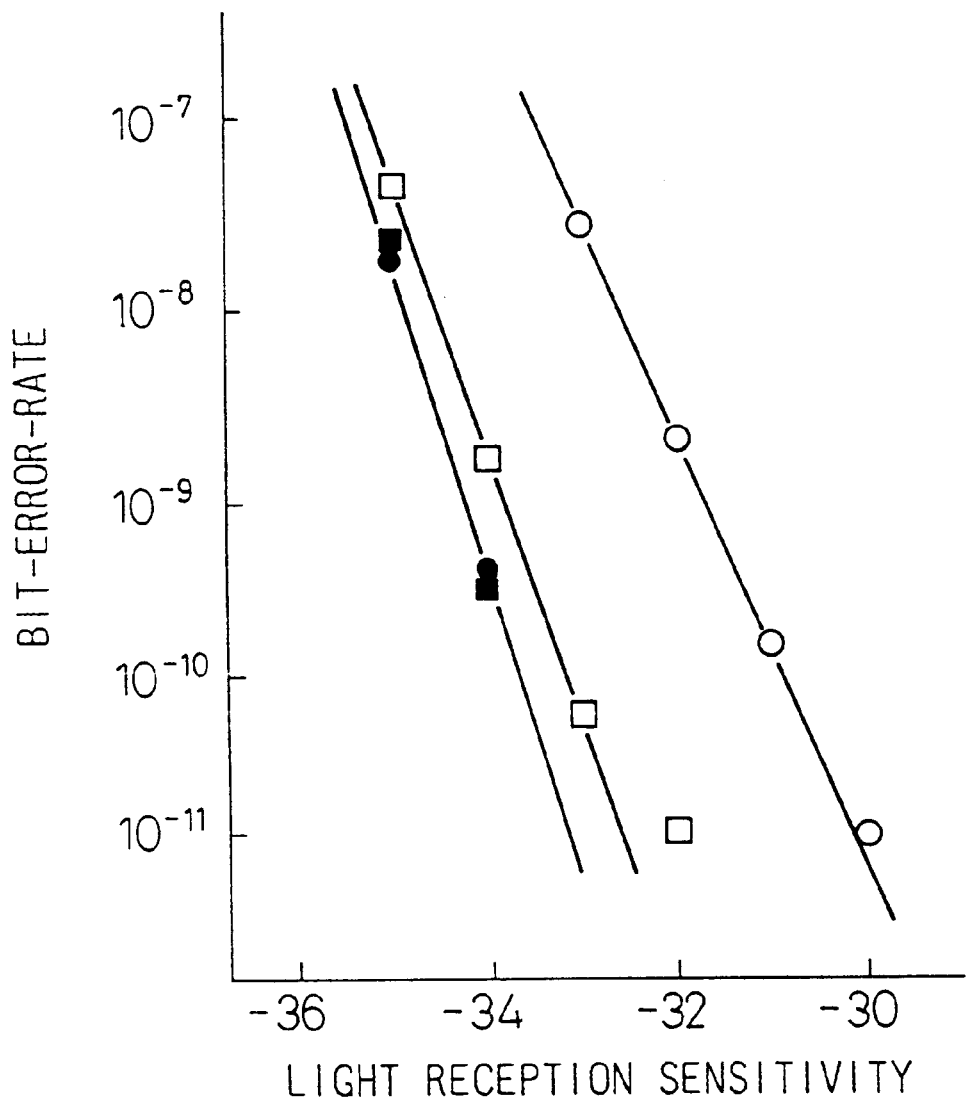
FIG. 16 shows the improvement provided by the first embodiment in terms of a bit error rate.

FIG. 16 shows the improvement provided by the optical device of the first embodiment in the form of a change in bit error rate.

In FIG. 16, the bit error rate is measured by setting the resistances at the terminal resistor 7 and resistor 51 to 43 ohms and the transmission distance to 120 km. The impedance between the common conductive element 3 and ground is 0.3 nH. In the measurement, an Advantest R6144 is used as the constant current source. The abscissa represents a light reception sensitivity, and the ordinate represents the bit error rate. Circles indicate prior art results, namely, results of when the resistor element 115 of 43 ohm is not provided. Rectangles indicate results obtained in this embodiment, namely, results of when the resistor element 115 of 43 ohm is provided as shown in FIGS. 14 and 15. Filled circles and rectangles respectively indicate reference results occurring with a transmission distance of 0 km. Compared with the conventional device, the device of this embodiment is an apparent improvement. When a resistor having a value of more than 20 ohm is used as the resistor 51, the bit-error-rate can be improved.

As shown in FIGS. 14 and 15, in the first embodiment, the resistor element 115 corresponding to the resistor 51 is provided in the package of the optical module. However, the resistor 51 can be provided outside the package.

Figure 17:
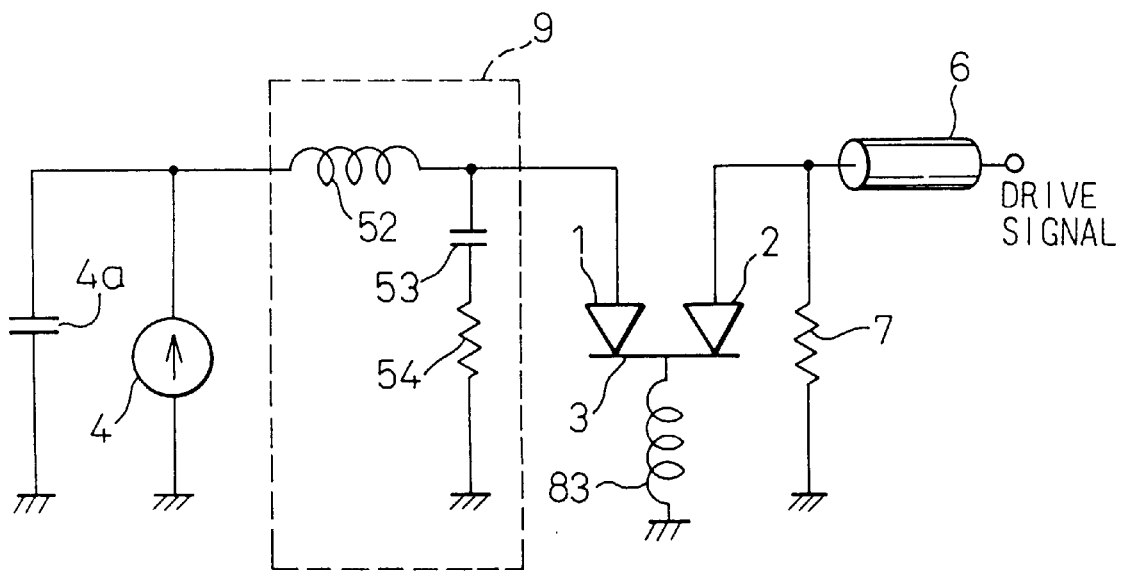
FIG. 17 is a circuit diagram of the second embodiment.

FIG. 17 is a circuit diagram of an optical semiconductor device circuit of the second embodiment of the present invention.

The difference from the first embodiment is that a series circuit 9 composed of an inductive element 52, a capacitive element 53 and a resistive element 54 is used in place of the resistor 51. The inductance of the inductive element 52 is 1 mH, the capacity of the capacitive element 53 is 20 pF, and resistance of the resistive element 54 is 43 ohms. In practice, the inductive element 52 and the capacitive element 53 are realized by a "Bias-Tee" 5550B made by Picosecond Lab. The series circuit 9 is provided outside the package of the optical module. Therefore, the optical module of the second embodiment has a configuration almost same to that of the first embodiment except that the resistor 115 is omitted.

Figure 18:
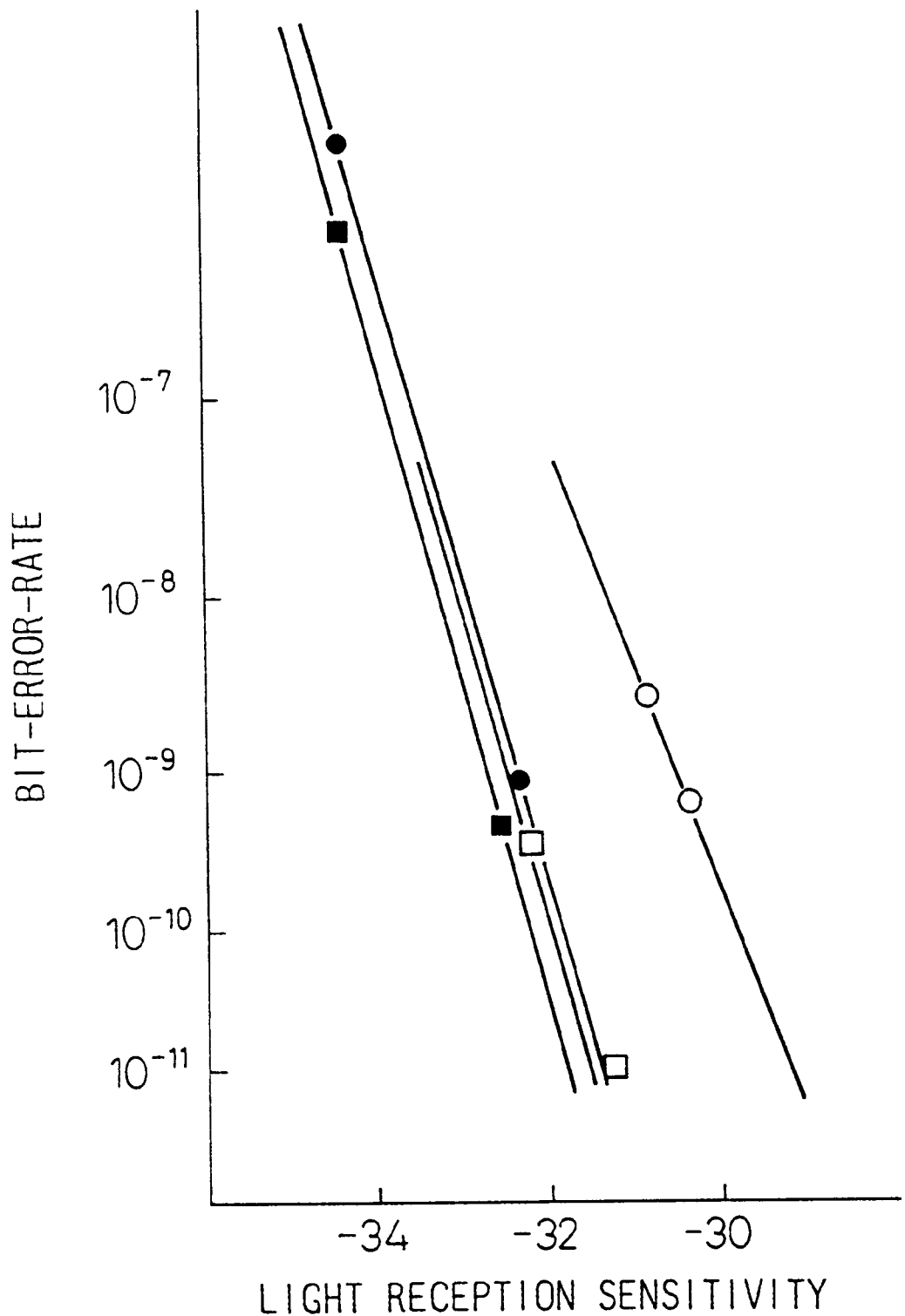
FIG. 18 shows the improvement provided by the second embodiment in terms of a bit error rate.

FIG. 18 shows the improvement provided by the optical device of the second embodiment. FIG. 18 also shows a change in bit error rate in a form similar to that in FIG. 16.

According to this embodiment, similar to the first embodiment, a high frequency signal occurring at the common connection element 3 modulator will not appear in the semiconductor laser diode.

Figure 19:
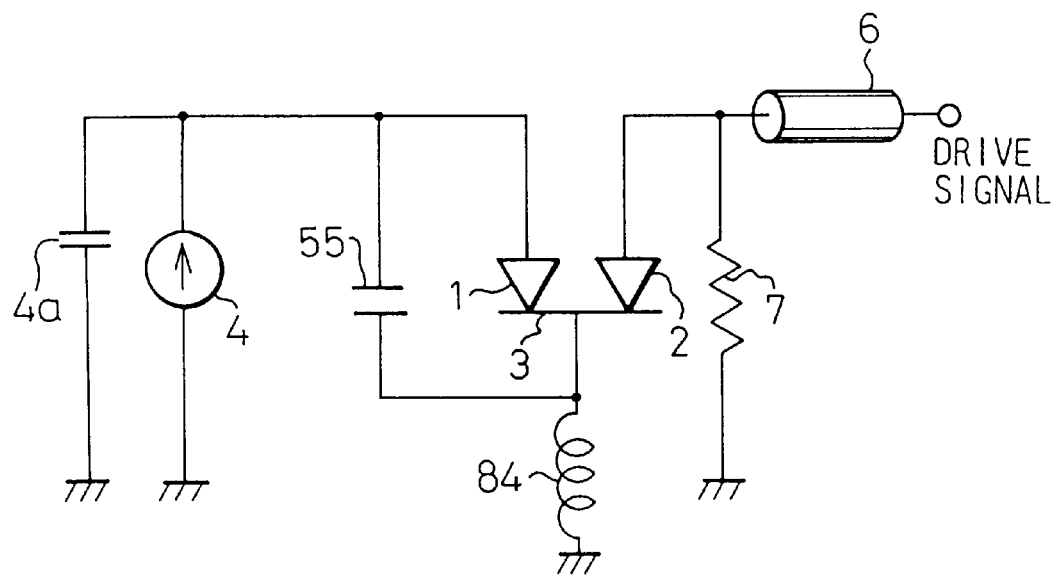
FIG. 19 is a circuit diagram of the third embodiment.

FIG. 19 is a circuit diagram showing an optical semiconductor device circuit of the third embodiment of the present invention.

A difference from the first and second embodiments is that a bypass capacitor 55 is connected in parallel with the semiconductor laser diode 1.

Figure 20:
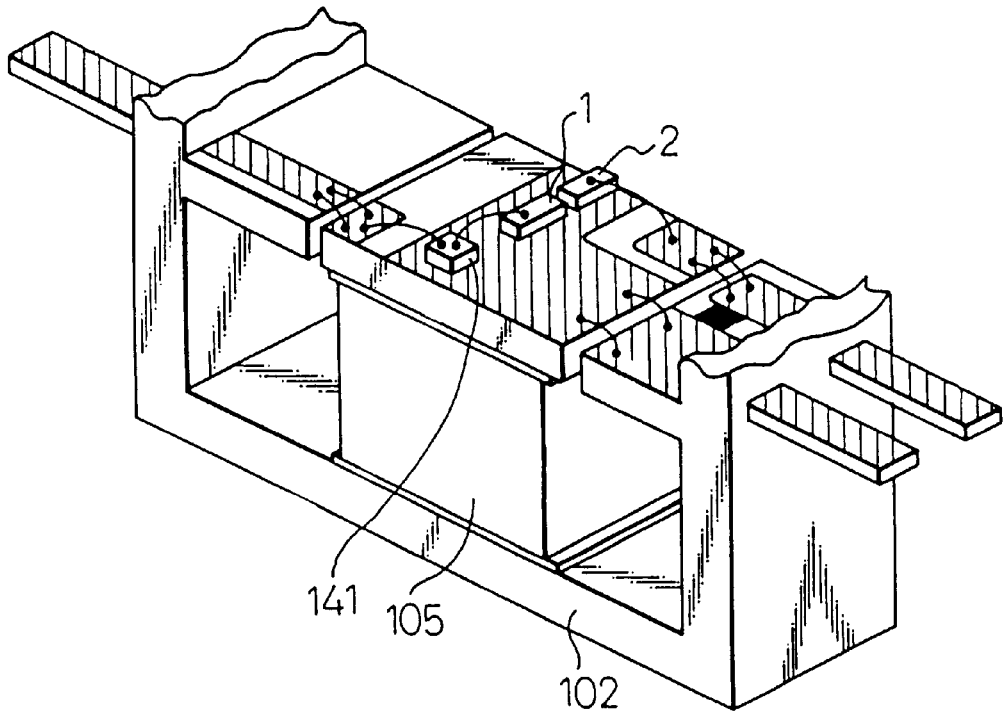
FIG. 20 is a perspective view showing a configuration of bonding wires connecting terminals of the lead pins, electrode pads and an element on the substrate, and on the MI-DFB-LD of the third embodiment.
Figure 21:
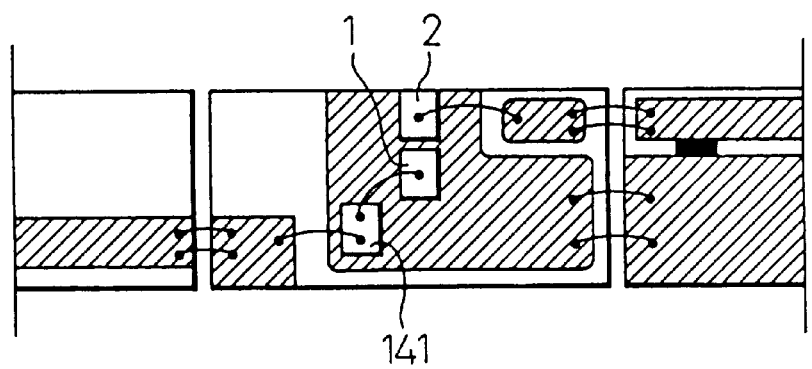
FIG. 21 is a plan view of the part shown in FIG. 20.

FIG. 20 is a perspective view showing a configuration of the bonding wires connecting the lead pins, the electrode pads and an element on the substrate, and the MI-DFB-LD of the third embodiment. FIG. 21 is a plan view of the part shown in FIG. 20

As shown in FIGS. 20 and 21, the configuration in the package of the third embodiment is almost the same as that of the first embodiment except that a micro-chip capacitor 141 is provided on the semiconductor substrate. The micro-chip capacitor 141 serves as the bypass capacitor 55. The top of the micro-chip capacitor 141 is connected to the top of the semiconductor laser diode 1.

Figure 22:
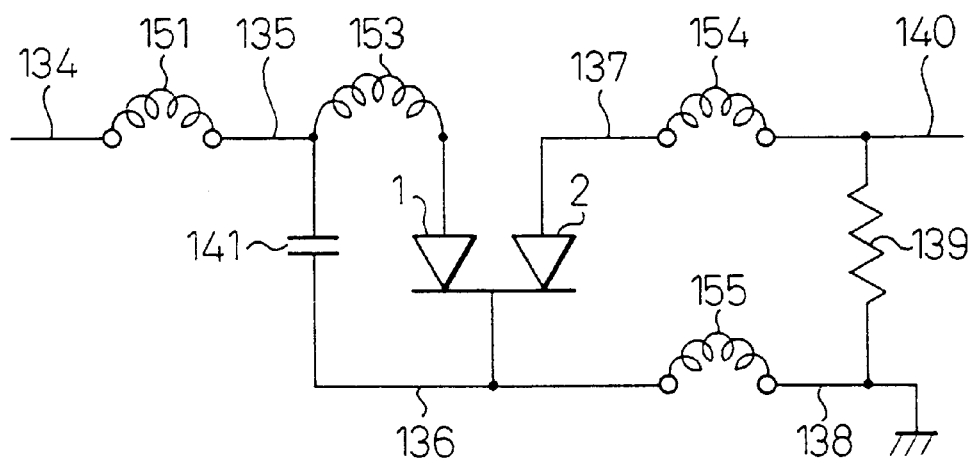
FIG. 22 is an equivalent circuit diagram of an optical module of the third embodiment.

FIG. 22 is an equivalent circuit diagram of the third embodiment. In FIG. 22, reference numerals 151, 153, 154 and 155 denote impedances corresponding to the bonding wires. As described above, it is required that one of electrodes of the bypass capacitor 55 is directly connected to the common conductive element 3. Therefore, the capacitor is practically realized by the micro-chip capacitor 141 arranged on the semiconductor substrate.

The capacity of the bypass capacitor 55 is appropriate to be between 1 pF and 1 nF, particularly, 100 pF is most appropriate. The capacitor cuts off direct current but passes high-frequency signals. Constant current supplied by the constant current source 4 flows through the semiconductor laser diode 1. High-frequency current resulting from a voltage fluctuation triggered by a drive signal sent from the optical modulator 2 flows through the bypass capacitor 55. The influence of a variation in high-frequency current upon light emission from the semiconductor laser diode 1 is thus successfully suppressed.

Figure 23:
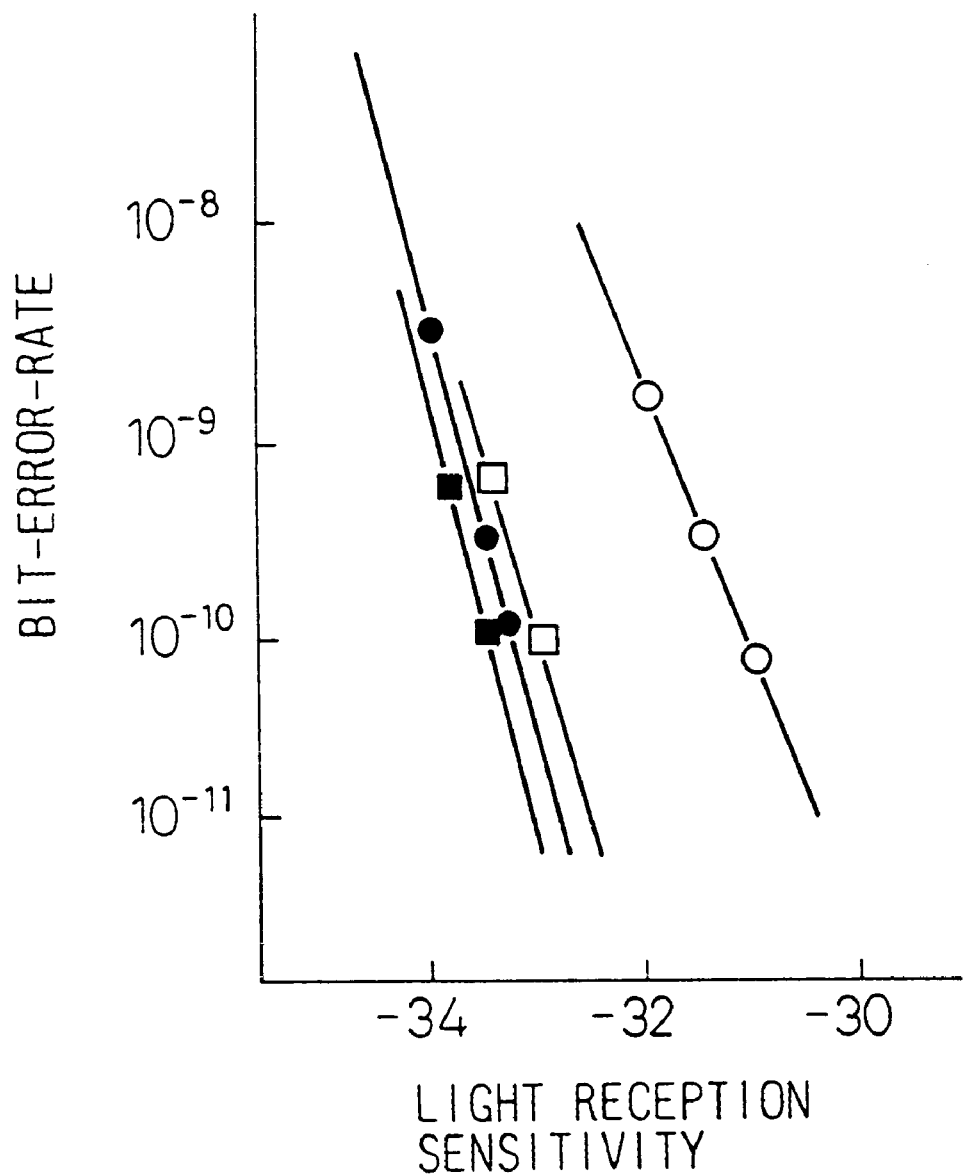
FIG. 23 shows the improvement provided by the third embodiment in terms of a bit error rate.

FIG. 23 shows the improvement provided by the optical device of the third embodiment. FIG. 23 also shows a change in bit error rate in a form same to those of FIGS. 16 and 18.

According to this embodiment, similarly to the first embodiment, an abrupt current fluctuation, produced at the common connection element, will not appear in the semiconductor laser diode.

The document "Electrical and Optical Interactions between Integrated InGaAsP/InP DFB Lasers and Electro-absorption Modulators" in the Journal of Lightwave Technology. Vol.6, No. 6, June 1988 discloses a constitution in which a capacitor is provided in parallel to the laser diode. The difference between the present invention and the document will be explained.

Figure 24:
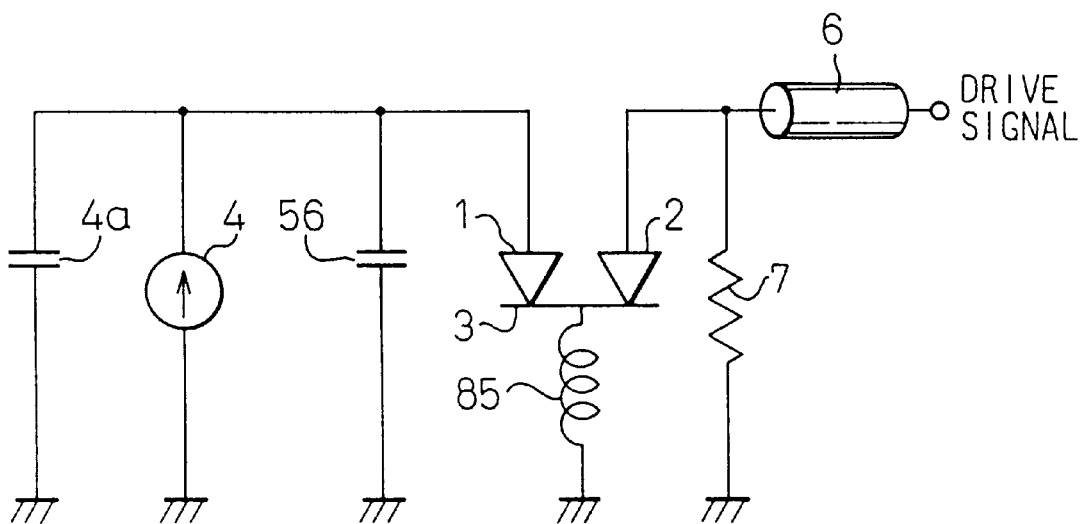
FIG. 24 is a circuit diagram of the prior art optical device.

Although the above document does not clearly disclose the arrangement position of the capacitor, it is judged to disclose a circuit diagram shown in FIG. 24. In FIG. 24, one terminal of the capacitor 56 is connected to an electrode of the semiconductor laser diode to which the power supply is connected, and the other terminal of the capacitor 56 is connected to ground. As described above, in order to reduce the influence of the fluctuation of the drive signal to the laser diode, the capacitor is required to be directly connected to the common conductive element 3. However, since the capacitor 56 is not directly connected to the common conductive element 3, the bypass is not formed by the capacitor 56. According to the above document, the influence of the fluctuation of the drive signal to the laser diode cannot be fully reduced.

As described above, according to the present invention, the extension in the wavelength of the output light of an optical device, in which a semiconductor laser diode and an optical modulator are formed on the same semiconductor substrate, can be minimized. The transmission speed and distance for optical communication can therefore be increased.

We claim:

1. An optical semiconductor device comprising:

a semiconductor laser diode;

a power supply including a bias current source for biasing said semiconductor laser diode;

an optical modulator for modulating the light output from said semiconductor laser diode in response to an applied modulation signal, said semiconductor laser diode and said optical modulator installed in a package;

a resistive element connected to an electrode of said semiconductor laser diode to which a bias current from said bias current source is input to generate light, said resistive element substantially operating as a resistor at least at a high frequency and said resistive element being connected to a capacitive element in series to form a series circuit, said series circuit being connected between a power connection terminal of said package and ground outside said package;

common connector means connected to one electrode of said semiconductor laser diode and to one electrode of said optical modulator;

at least one of impedance means and signal reflection means connected to said common connection means; and ground means connected to at least one of said impedance means and said signal reflection means.

2. An optical semiconductor device according to claim 1, comprising an inductive element connected in series with semiconductor laser diode.

3. An optical module comprising:

a semiconductor laser diode;

an optical modulator for modulating the light output from said semiconductor laser diode in response to an applied modulation signal; and resistor means connected via a capacitive element to an electrode of said semiconductor laser diode, to which a bias current is input to generate light, said resistor means operating as a resistor at least at a high frequency.

* * * * *